(12) United States Patent
Almonte

(10) Patent No.: US 7,683,630 B2
(45) Date of Patent: Mar. 23, 2010

(54) SELF TEST, MONITORING, AND DIAGNOSTICS IN GROUPED CIRCUITRY MODULES

(75) Inventor: Kenneth V. Almonte, Portland, OR (US)

(73) Assignee: Electro Scientific Industries, Inc., Portland, OR (US)

(*) Notice: Subject to any disclaimer, the term of this patent is extended or adjusted under 35 U.S.C. 154(b) by 188 days.

(21) Appl. No.: 11/565,308

(22) Filed: Nov. 30, 2006

(65) Prior Publication Data

US 2008/0133153 A1 Jun. 5, 2008

(51) Int. Cl.
*G01R 31/12* (2006.01)
*H01H 31/02* (2006.01)
(52) U.S. Cl. .................... 324/548; 324/555
(58) Field of Classification Search ............ 324/548
See application file for complete search history.

(56) References Cited

U.S. PATENT DOCUMENTS

| | | | |
|---|---|---|---|
| 4,267,503 A | 5/1981 | Westra | |
| 4,931,721 A | 6/1990 | Berrigan et al. | |
| 5,034,749 A | 7/1991 | Jungblut et al. | |
| 5,057,772 A | 10/1991 | Bruno et al. | |
| 5,510,719 A | 4/1996 | Yamamoto | |
| 5,673,799 A | 10/1997 | Braden | |
| 5,677,634 A | 10/1997 | Cooke et al. | |
| 6,040,705 A | 3/2000 | Garcia et al. | |
| 6,043,665 A | 3/2000 | Nishioka et al. | |
| 6,100,707 A | 8/2000 | Baumann et al. | |
| 6,198,290 B1 | 3/2001 | Krinker | |
| 6,225,808 B1 * | 5/2001 | Varghese et al. | 324/426 |
| 6,459,707 B1 | 10/2002 | Becker | |
| 6,518,777 B2 | 2/2003 | Kamitani et al. | |
| 6,677,637 B2 | 1/2004 | Bernstein et al. | |
| 6,714,028 B2 | 3/2004 | Garcia et al. | |
| 6,725,721 B2 | 4/2004 | Venczel | |
| 6,882,015 B2 | 4/2005 | Bernstein et al. | |
| 6,907,363 B1 | 6/2005 | Wyant et al. | |
| 7,095,235 B2 * | 8/2006 | Fiebig et al. | 324/417 |
| 7,136,778 B2 * | 11/2006 | Duron et al. | 702/182 |
| 7,173,432 B2 | 2/2007 | Garcia et al. | |
| 7,173,438 B2 * | 2/2007 | Pooranakaran et al. | 324/678 |
| 7,307,485 B1 * | 12/2007 | Snyder et al. | 331/150 |
| 2005/0184899 A1 | 8/2005 | Witte et al. | |
| 2005/0231204 A1 * | 10/2005 | Martin et al. | 324/415 |
| 2006/0170435 A1 * | 8/2006 | Granicher et al. | 324/754 |

* cited by examiner

*Primary Examiner*—Jeff Natalini
(74) *Attorney, Agent, or Firm*—Young Basile

(57) ABSTRACT

A rotary capacitor electrical test system for providing a power source to a capacitor under electrical test can include at least one programmable voltage source, at least one programmable current source, and a controller for programming the voltage and current sources. Random access, non-volatile, memory can be provided for storing information and for providing read/write capability for the controller. At least one digital/analog converter can communicate between the controller and the programmable voltage and current sources. A diagnostic program is operable through the controller for testing internal integrity of basic input/output functions of at least some subsystems. A circuit health monitoring program can operate through the controller for periodically testing and determining internal integrity of at least some subsystems. A self test program can operate through the controller for determining if at least some internal subsystems are working properly on a test/fail basis.

17 Claims, 1 Drawing Sheet

SELF TEST, MONITORING, AND DIAGNOSTICS IN GROUPED CIRCUITRY MODULES

FIELD OF THE INVENTION

The invention relates to a rotary capacitor electrical test system for providing power source to a capacitor under electrical tests, and in particular, a rotary capacitor electrical test system having self test, monitoring, and diagnostic capability in grouped circuitry modules.

BACKGROUND

Devices for automatically ascertaining capacitance, dissipation factor and insulation resistance of a plurality of capacitors to be tested are generally known, for example, see U.S. Pat. No. 4,931,721. A known rotary capacitor electrical test system includes an instrument that provides the voltage source to a capacitor under electrical test. The instrument contains two groups of four different types of circuit boards that plug vertically into a card cage. The boards can be inserted and removed independently. These boards work together to provide the voltage source, current source, and output voltage measurement capability. The circuitry is split into four separate circuit boards because it is not feasible to fit all of this circuitry into the available form factor. When assembling a system for the first time, in-circuit verification can take place on the individual circuit boards, and a test fixture can be made to test each board. However, the group of boards cannot be tested together until they are all installed in the system, and a system test procedure is run. When there is a failure in this group of boards, it is not immediately apparent which board in the group has failed. Therefore, all four boards must be checked for problems.

When boards do fail, it is not known how long the board has been in operation, what its output conditions were, and what temperatures the board has been subjected to. This data would be useful in determining the lifetime of the circuitry and understanding the failure modes and vulnerabilities.

Some failures might be able to be prevented if it were possible to monitor sensitive circuitry and shut it down or flag an error when certain limits are reached. Without onboard intelligence, this is more difficult to do.

Another problem is warranty tracking of these circuit boards. If a customer takes a board from a spare system to get a failed system running again, this is a violation of warranty policy. However, there is no way to track this event aside from a handwritten serial number written on the Printed Circuit Board (PCB)

Individual boards can be tested separately in many different ways to ensure they were built properly. However, they eventually need to be plugged into a system to verify that they are working with each other, so an in-system test must be run. If a failure is detected, it must be diagnosed in-system.

Existing electrical capacitor test instruments do not use a modular approach. Limited internal read back capability is present in the existing systems, so a number of external meters must be used to troubleshoot and calibrate the boards in-system. Serialization is handled with handwritten numbers on the PCB, and is not known to the hardware.

SUMMARY

A rotary capacitor electrical test system for providing a power source to a capacitor under electrical test can include at least one programmable voltage source, at least one programmable current source, and a controller for programming the voltage and current sources. Random access, non-volatile, memory can be provided for storing information and for providing read/write interface capability for the controller. At least one digital/analog converter can be provided for communicating between the controller and the programmable voltage and current sources. The system can include a diagnostic program operable through the controller for testing internal integrity of basic input/output function of at least some subsystems. The system can be provided with a circuit health monitoring program operable through the controller for periodically testing and determining internal integrity of at least some subsystems. A self test program can operate through the controller for determining if at least some internal subsystems are working properly on a test/fail basis.

Other applications of the present invention will become apparent to those skilled in the art when the following description of the best mode contemplated for practicing the invention is read in conjunction with the accompanying drawings.

BRIEF DESCRIPTION OF THE DRAWINGS

The description herein makes reference to the accompanying drawings wherein like reference numerals refer to like parts throughout the several views, and wherein.

DETAILED DESCRIPTION

Figure 1:
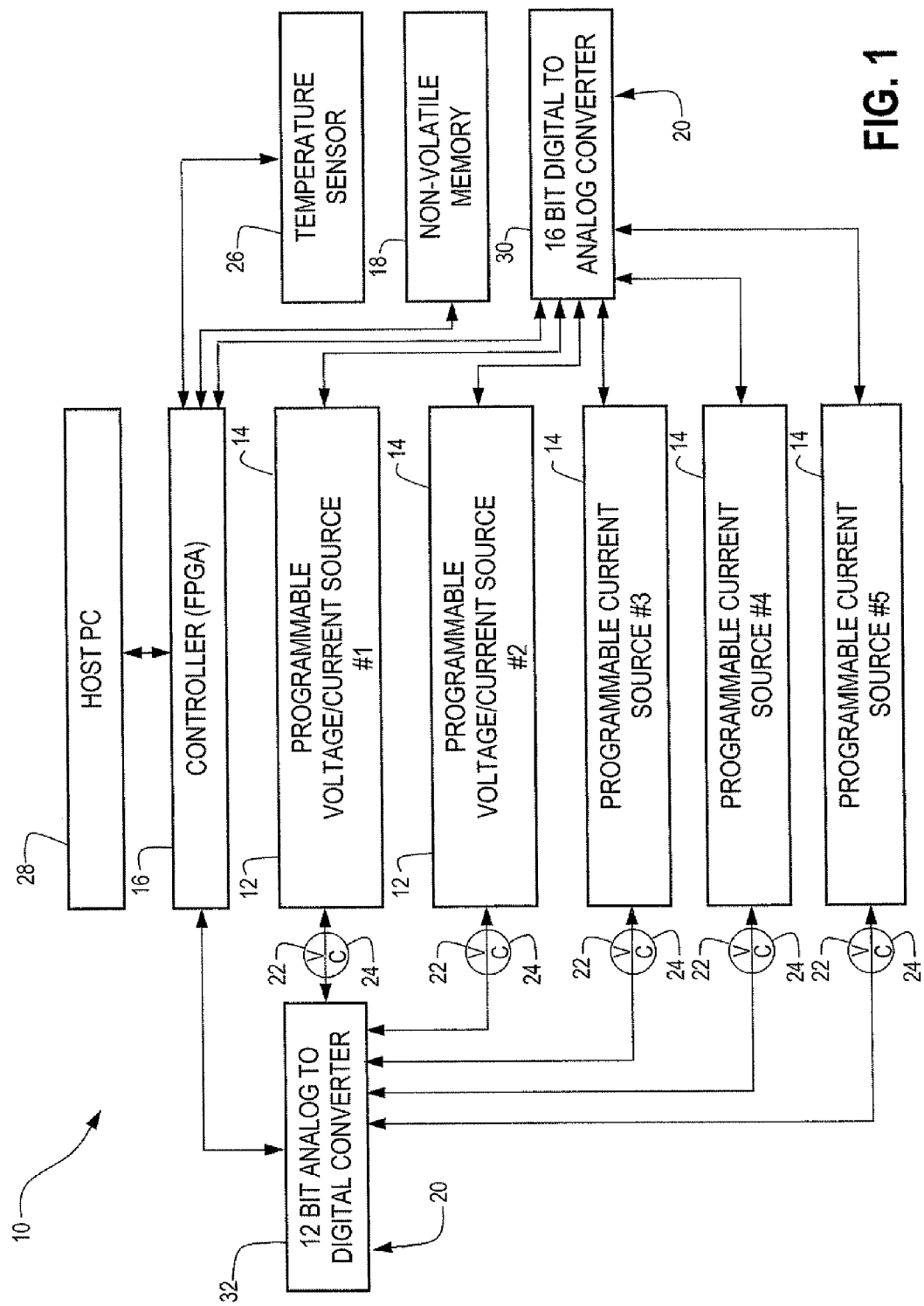
FIG. 1 is a schematic view of sub systems in a rotary capacitor electrical test system for providing a power source to a capacitor under electrical test according to an embodiment of the present invention.

The next generation source and measurement instrument for capacitor electrical testing combines all the circuitry necessary for outputting a test voltage waveform onto one mechanical assembly. This assembly contains two circuit boards mounted parallel to one another and connected via board-to-board connectors. This assembly will be referred to as a module. This assembly exploits the modular nature of the instrument to improve the diagnostic capability, health monitoring and self testability.

Of course, the initial step is performed of verifying that a circuit board is assembled correctly and that it powers up properly. Once this step is complete, the boards can be assembled together and module testing can begin.

The module is designed to plug into a backplane that communicates with a Master Controller over a high speed parallel bus. The Master Controller talks to a host PC which can run a diagnostic interface to test the module. The board that plugs into the backplane has an FPGA which decodes address and data into commands and executes the proper functions on the module. Having this intelligence on the board and being able to communicate to the board using a diagnostic interface can provide a technician with more information to narrow down where a failure may have occurred.

The main parts of this particular module are five independently controlled programmable current sources and two independently controlled programmable voltage sources. It is possible to program the current using a 16-bit digital-to-analog converter, and it is possible to read back that current using a 12-bit analog-to-digital converter on all five channels. It is also possible to measure the output voltage of each of the five channels, as well as the output of each of the voltage sources. Therefore, it is possible in the diagnostic interface to run a read-back test where a voltage is set and then read back, and a current is set and then read back. If the read-back currents and voltages are within an acceptable range, it can be said that those subsystems are working. Other software can be used with an external instrument to verify accuracy and perform calibration, but this method gives a first-order check of the circuitry. If a channel is bad, the technician can trace through the chain of circuitry to find the failure. For maximum automation, this whole routine could be put into a software loop and executed on all the channels in sequence. The data could then be compared with limits and a pass/fail result is displayed. Temperature sensors on the heat sinks of the high power section can monitor the temperature and signal an error if a limit is reached. The shut down of the error-causing circuitry can happen immediately because communication between boards in a module can happen directly.

Non-volatile memory in the module is included to store information after the power is turned off. It can be very useful in several ways. This memory can store a unique electronic serial number to aid in tracking boards enforcing warranty issues. It can also be useful in tracking when and where a board was manufactured and tested. In addition, during operation the memory could be updated with information about the amount of time it has been running, and statistics such as the average ambient and heat sink temperatures as well as the output voltages and current. In the event of a failure, this data could be read back and may provide clues to when, how, and why the board failed.

Self testing is a superset of diagnostic capability. The diagnostics provide the lowest level functions to read and write to circuitry in the module. A higher level function or program can use these functions to test complete subsystems on the module. The ability to read back results after setting outputs allows this test procedure to get automatic feedback from the test, hence the term "self-test". These procedures can be executed on power-up of the system, or on demand.

Diagnostics, monitoring, and self-test capability are not a new concept in modern systems. However, the concept of a platform that accepts plug-in modules instead of an instrument that performs a specific function is a new one for the capacitor electrical test industry. Modules are easier to maintain and test, and provide a clear path for incremental development that can reuse existing design.

Keeping the boards as a mechanical assembly discourages tampering with the individual boards of the module. As long as the boards are kept together, their revisions will be compatible and any calibration information will be relevant.

Modules in the next generation capacitor electrical test instrument contain high power circuitry that can operate at high voltages up to and above 300VDC. Therefore, monitoring of the heat sink and power output circuitry is important to prevent fires and failures. If a temperature reaches its limit trip point, the entire module can be shut down immediately to remove the hazard and flag an error to the main controller. If a module fails during operation, it can be pulled out and replaced with a new module. This ensures that a failed system returns to operation in as short amount of time as possible. Once the failed module is out of the system, it can be put into another diagnostic system to pinpoint the failure. It is better for this troubleshooting time to happen while the board is offline, so the customer can get back to production. If the board has internal read back capability in key areas, a software routine can be written to automate the testing process. If this does not exist, a similar process can be followed using external instruments that would still help to pinpoint the problem.

To aid in determining how and why a board fails, non-volatile memory in the modules can be updated periodically with heat sink and ambient temperatures, output voltage, a timestamp, and any other relevant information about the module. When a failure occurs, it can also be recorded in memory. When the module is removed and put through a test procedure, this logged data can be reviewed to aid in troubleshooting.

A module can also be individually tested before it is installed in its target system. If it is found to be faulty initially, the same diagnostic interface can be used to track down the problem before it gets installed in a system.

The modular approach can result in reduced circuitry in some cases. When boards are grouped into a module, only one board in the module needs to interface with the backplane. This means that some backplane interface circuitry could be removed from the overall system, since the boards connect to one another and can communicate that way.

Referring now to FIG. 1, a rotary capacitor electrical test system 10 according to an embodiment of the invention provides a power source to a capacitor to be electrically tested. The system 10 includes at least one programmable voltage source 12 and at least one programmable current source 14. A controller 16 is provided for programming the voltage and current sources 12, 14. Random access, non-volatile, memory 18 provides read/write interface capability for the controller and can be used for storing information. At least one digital/analog converter 20 provides communication between the controller 16 and the programmable voltage and current sources 12, 14. The controller 16 can be in the form of a field programmable gate array (FPGA).

An output voltage sensor 22 measures an output voltage value and communicates with the controller 16 for determining if a programmed voltage value has been successfully delivered. An output current sensor 24 measures an output current value and communicates with the controller 16 for determining if a programmed current value has been successfully delivered. At least one temperature sensor 26 can be provided for monitoring the programmable voltage and current sources 12, 14. The controller 16 can compare a measured temperature value to determine if a threshold value has been exceeded and, if the threshold value has been exceeded, the controller 16 shuts down a corresponding voltage and current source 12, 14 sub system generating excess heat sensed by the measured temperature value determined to be over the threshold value.

The controller 16 interacts with information stored in the random access, non-volatile, memory 18. The information read and/or written by the controller 16 can include data selected from a group consisting of a cumulative printed circuit board operating time, and maximum printed circuit board operating temperature, an average printed circuit board operating temperature, a maximum printed circuit board output condition, an average printed circuit board output condition, internal printed circuit board identification information, an electronic printed circuit board serial number, a printed circuit board manufacturing date, a printed circuit board manufacturing location, a printed circuit board firmware version, a printed circuit board software version, an average ambient temperature, a maximum ambient temperature, an average heat sink temperature, a maximum heat sink temperature, an average voltage output, a maximum voltage output, an average current output, a maximum current output, a last printed circuit board test date, a last printed circuit board test result, and any combination thereof.

A host computer 28 can be connected in communication with the controller 16 for running a self test program to set at least one programmable value through a 16 bit digital to analog converter 30 and to receive back a measured value through a 12 bit analog to digital converter 32 to test at least one complete subsystem through the controller 16 to determine if the tested complete subsystem is operating properly.

A diagnostic program is operable through the controller 16 for testing internal integrity of basic input and output functions of at least some subsystems. A circuit health monitoring program can operate through the controller 16 for periodically testing and determining internal integrity of at least some subsystems. A self test program can operate through the controller 16 for determining at least some internal subsystems are working properly on a test/fail basis. The controller 16 can program an output of a test voltage wave form and can program an output of a test current wave form.

While the invention has been described in connection with what is presently considered to be the most practical and preferred embodiment, it is to be understood that the invention is not to be limited to the disclosed embodiments but, on the contrary, is intended to cover various modifications and equivalent arrangements included within the spirit and scope of the appended claims, which scope is to be accorded the broadest interpretation so as to encompass all such modifications and equivalent structures as is permitted under the law.

What is claimed is:

1. In an electrical test system for providing a power source to each of a plurality of electrical components under electrical test, the test system to be in electrical contact with each electrical component to be tested by measuring at least one voltage value and at least one current value for each electrical component under electrical test, the improvement comprising:
    at least one programmable voltage source coupled to a respective voltage output channel;
    at least one programmable current source coupled to a respective current output channel;
    a controller configured to program a voltage source of the at least one programmable voltage source to deliver a programmed voltage value to its respective voltage output channel and to independently program a current source of the at least one programmable current source to deliver a programmed current value to its respective current output channel;
    random access, non-volatile, memory for storing information and for providing read/write interface capability for the controller;
    at least one digital/analog converter for communicating between the controller and the programmable voltage and current sources; and a host computer in communication with the controller for running a self test program to set at least one programmable value and to receive back a measured value to test at least one complete subsystem through the controller to determine if the tested complete subsystem is operating properly.

2. The improvement of claim 1, wherein the controller further comprises a field programmable gate array.

3. The improvement of claim 1 further comprising:
    an output voltage sensor for measuring an output voltage value of the voltage source at its respective voltage output channel and in communication with the controller, the controller configured to compare the output voltage value to the programmed voltage value to determine if the programmed voltage value has been successfully delivered.

4. The improvement of claim 1 further comprising:
    an output current sensor for measuring an output current value of the current source at its respective current output channel and in communication with the controller, the controller configured to compare the output current value to the programmed current value to determine if the programmed current value has been successfully delivered.

5. The improvement of claim 1 further comprising:
    a diagnostic program operable through the controller for testing internal integrity of basic input/output functions of at least some subsystems.

6. The improvement of claim 1 further comprising:
    a circuit health monitoring program operable through the controller for periodically testing and determining internal integrity of at least some subsystems.

7. The improvement of claim 1 further comprising:
    a self test program operable through the controller for determining if at least some internal subsystems are working properly on a test/fail basis.

8. The improvement of claim 1, wherein the at least one programmable current source and the at least one programmable voltage source further comprises:
    five independently controlled programmable current sources; and
    two independently controlled programmable voltage sources.

9. The improvement of claim 1, wherein the programmed voltage value is a test voltage waveform.

10. The improvement of claim 1, wherein the programmed current value is a test current waveform.

11. The improvement of claim 1 further comprising:
    at least one temperature sensor for monitoring the programmable voltage and current sources.

12. The improvement of claim 11, wherein the controller compares a measured temperature value to determine if a threshold value has been exceeded and, if the threshold value has been exceeded, the controller shuts down a corresponding voltage and current source subsystem generating excess heat sensed by the measured temperature value determined to be over the threshold value.

13. The improvement of claim 1 wherein the controller interacts with information stored in random access non-volatile memory and the information is data selected from a group consisting of cumulative board operating time, maximum board operating temperature, average board operating temperature, maximum board output condition, average board output condition, internal board identification information, electronic board serial number, board manufacturing date, board manufacturing location, board firmware version, board software version, average ambient temperature, maximum ambient temperature, average heat sink temperature, maximum heat sink temperature, average voltage output, maximum voltage output, average current output, maximum current output, last circuit test date, last circuit test result, and any combination thereof.

14. An electrical test system for providing a power source to an electrical component under electrical test comprising:
    at least one programmable voltage source;
    at least one programmable current source;
    a controller for programming the voltage and current sources, wherein the controller programs an output of a test voltage waveform and a test current waveform for delivery to at least one output channel;
    random access, non-volatile, memory for storing information and for providing read/write interface capability for the controller, wherein the controller interacts with information stored in the random access non-volatile memory, and the information is data selected from a group consisting of cumulative board operating time, maximum board operating temperature, average board operating temperature, maximum board output conditions, average board output conditions internal board identification information, electronic board serial number, board manufacturing date, board manufacturing location, board firmware version, board software version, average ambient temperature, maximum ambient temperature, average heat sink temperature, maximum heat sink temperature, average voltage output, maximum voltage output, average current output, maximum current output maximum current output, and any combination thereof;

at least one digital/analog converter for communicating between the controller and the programmable voltage and current sources;

at least one temperature sensor for monitoring the programmable voltage and current sources and in communication with the controller for determining if a threshold temperature value has been exceeded;

an output voltage sensor for measuring an output voltage value and in communication with the controller for determining if a programmed voltage value from the programmable voltage source has been successfully delivered;

an output current sensor for measuring an output current value and in communication with the controller for determining if a programmed current value from the programmable current source has been successfully delivered; and a host computer in communication with the controller for running a self test program to set at least one programmable value and to receive back a measured value to test at least one complete subsystem through the controller to determine if the tested complete subsystem is operating properly.

15. The electrical test system of claim 14 further comprising:

a diagnostic program operable through the controller for testing internal integrity of basic input/output functions of at least some subsystems.

16. The electrical test system of claim 14 further comprising:

a circuit health monitoring program operable through the controller for periodically testing and determining internal integrity of at least some subsystems.

17. The electrical test system of claim 14 further comprising:

a self test program operable through the controller for determining if at least some internal subsystems are working properly on a test/fail basis.

* * * * *